United States Patent [19]

Selvin

[11] 4,126,840

[45] Nov. 21, 1978

[54] FILTER CONNECTOR

[75] Inventor: Gerald J. Selvin, Birmingham, Mich.

[73] Assignee: International Telephone and Telegraph Corporation, New York, N.Y.

[21] Appl. No.: 776,829

[22] Filed: Mar. 14, 1977

[51] Int. Cl.[2] ........................ H03H 7/04; H01G 4/40; H01R 33/80

[52] U.S. Cl. .................................... 333/79; 333/70 S; 339/147 R; 361/303; 361/306

[58] Field of Search ...................... 333/70 S, 79, 70 R, 333/73 C, 12; 361/301-304, 306, 311-314, 328, 330; 339/143 R, 147 R, 147 C, 278 R, 278 A, 278 M, 278 T

[56] References Cited

U.S. PATENT DOCUMENTS

| | | | |
|---|---|---|---|
| 1,949,996 | 3/1934 | Fleming | 333/79 |
| 3,448,355 | 6/1969 | Ahearn, Jr. et al. | 361/306 |
| 3,538,464 | 11/1970 | Walsh | 333/79 |
| 3,706,949 | 12/1972 | Kawakami et al. | 333/79 |
| 4,074,340 | 2/1978 | Leigh | 361/330 X |

*Primary Examiner*—Alfred E. Smith
*Assistant Examiner*—Marvin Nussbaum
*Attorney, Agent, or Firm*—Thomas L. Peterson

[57] ABSTRACT

A filter connector is disclosed for reducing electromagnetic interference. The connector may be in the form of an adaptor which is mounted between mating plug and receptacle members of electrical connectors, such as the type utilized in the telephone industry. The adaptor comprises a monolithic ceramic capacitor mounted between the termination ends of plug and receptacle connector members, with the edges of the capacitor disposed between the two rows of contacts in the connector members. The capacitor has a plurality of parallel, spaced live electrodes on its opposite faces engaging the contacts in the connector members. At least one ground plane is embedded in the ceramic substrate of the capacitor, and is coupled to the housing of the connector members. Other connector and capacitor circuit configurations are disclosed.

18 Claims, 9 Drawing Figures

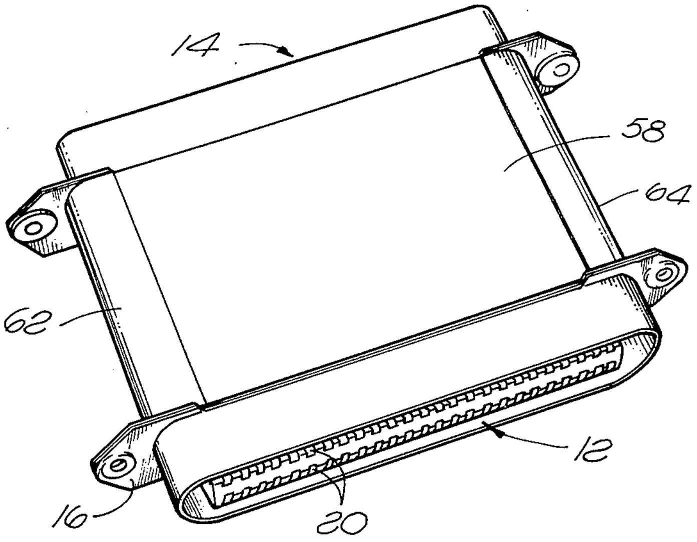
FIG. 1
FIG. 2
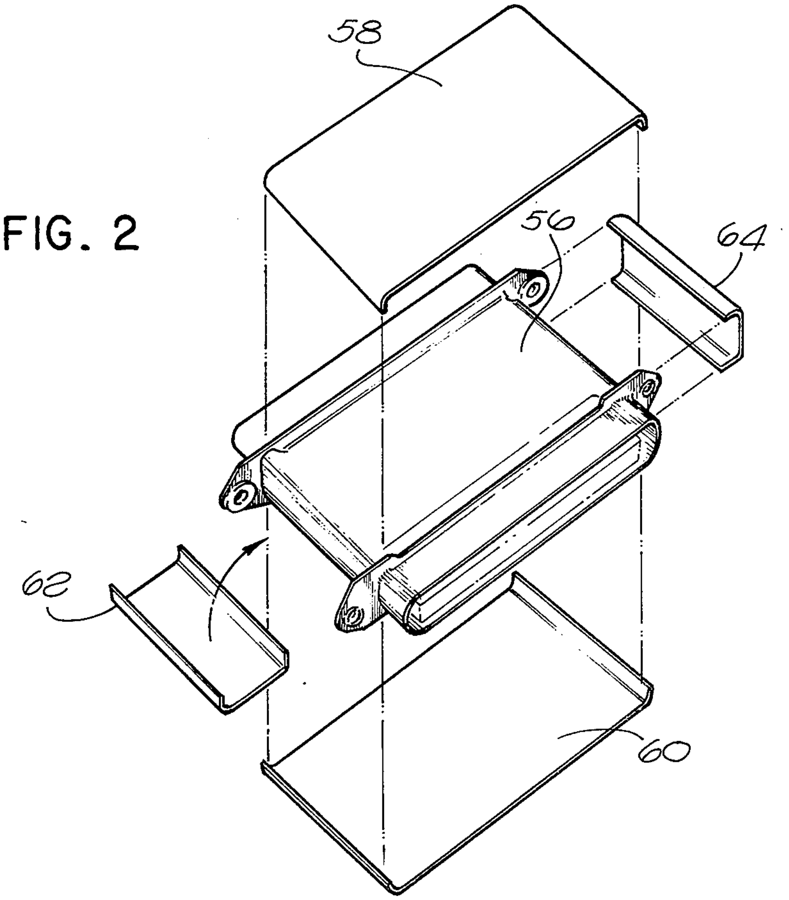

FIG. 3
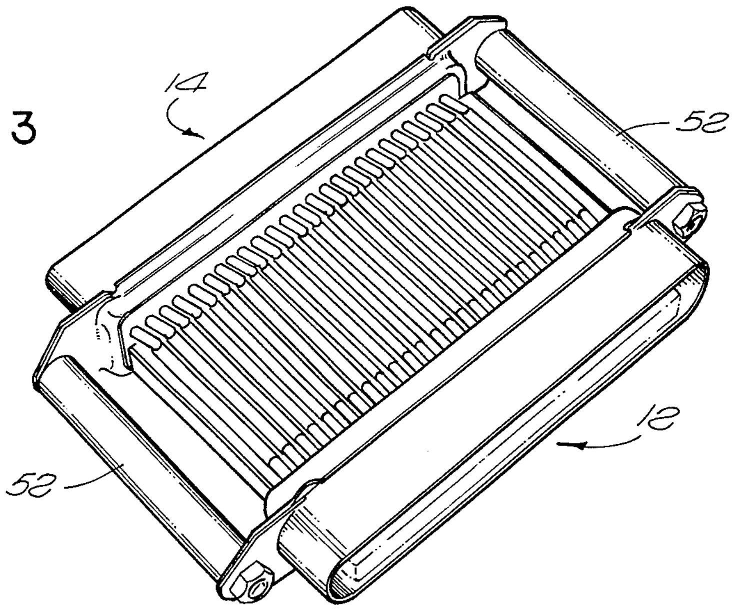
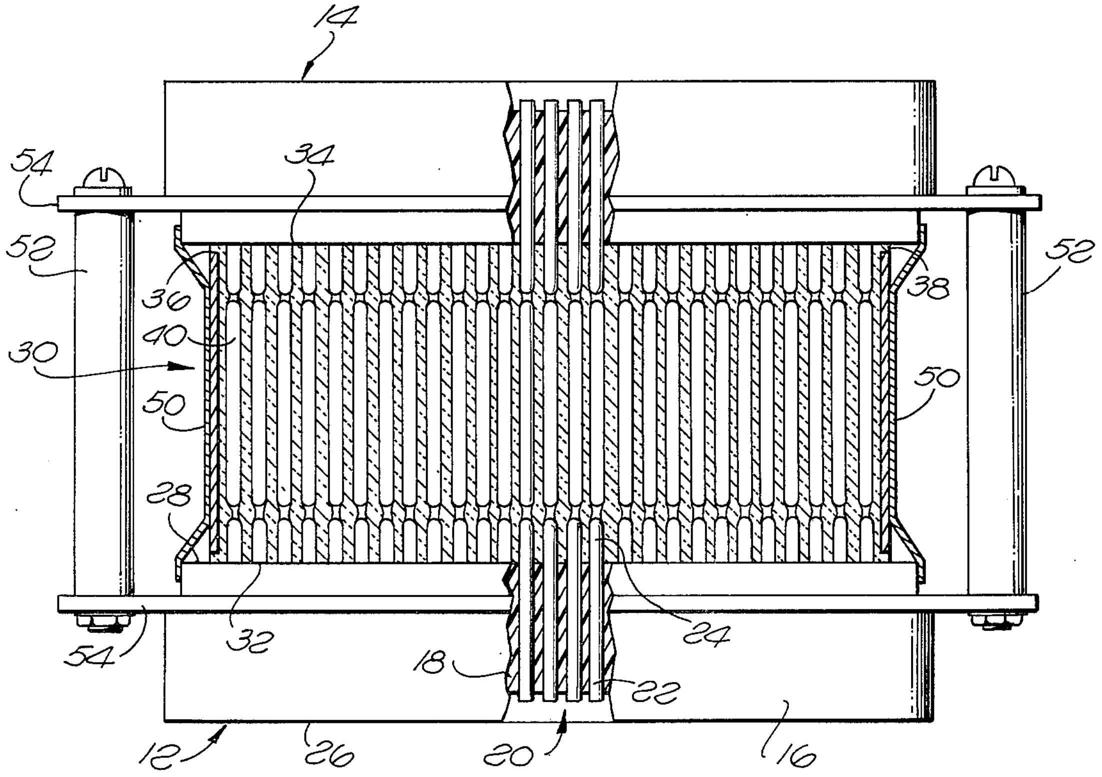
FIG. 4

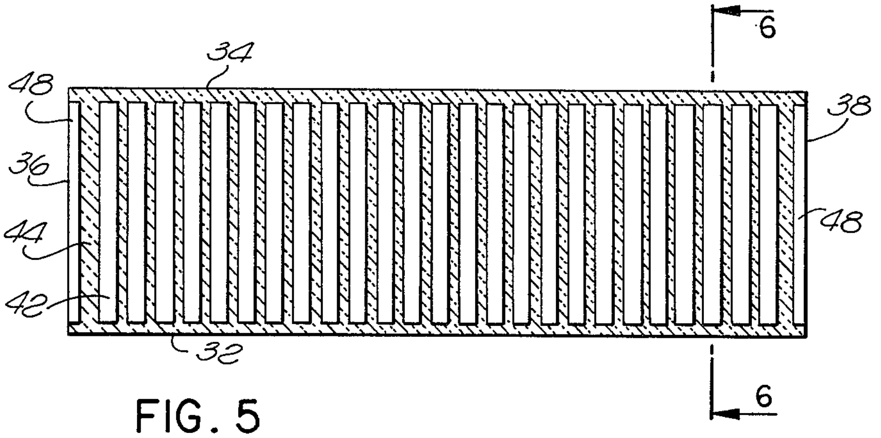
FIG. 5
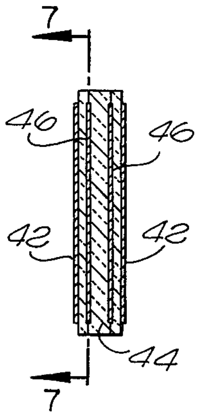
FIG. 6
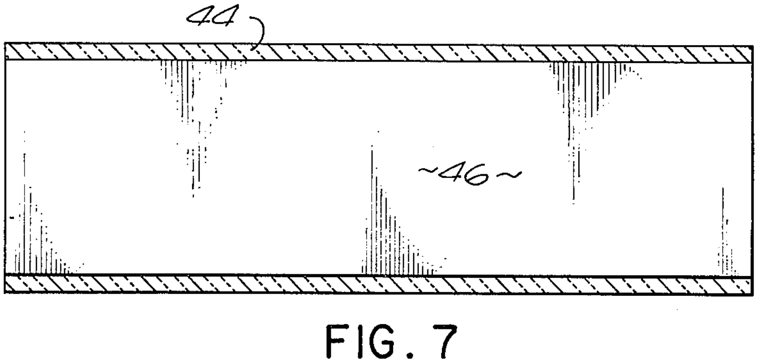
FIG. 7
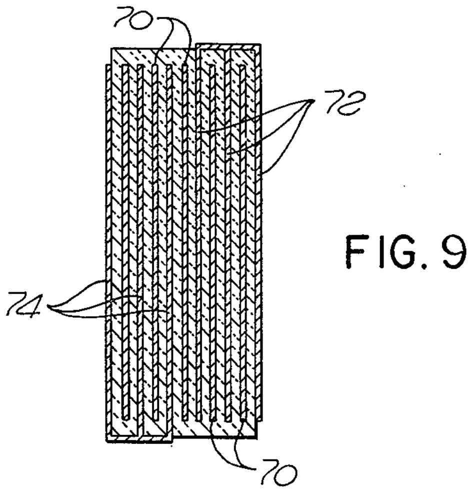
FIG. 9
FIG. 8
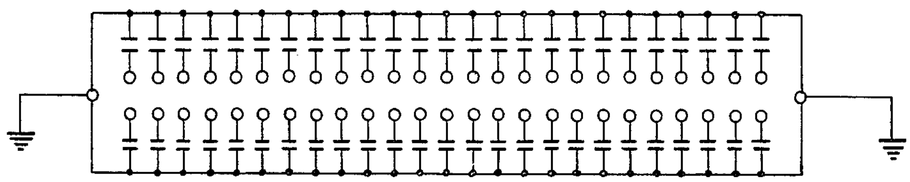

FILTER CONNECTOR

BACKGROUND OF THE INVENTION

The present invention relates generally to an electrical connector and, more particularly, to a filter electrical connector for reducing electro-magnetic interference.

A problem which is frequently encountered by users of electronic equipment is that of electro-magnetic interference (EMI). For example, complex solid state PBX systems utilized by the telephone industry are susceptible to interference from a number of noise generating sources. In addition, the high frequency switching circuits of the systems can also be a source of noise. Such interference may be reduced to some degree by enclosing the electronic equipment in a tight metal cover to provide an EMI tight structure. However, the problem still exists of economically filtering the hundreds of signal leads entering and leaving the PBX cabinet.

The ideal location for filter units is inside the connector for the signal leads. Filter connectors are well known in the art. In one form, each electrical contact in the connector is provided with its individual filter assembly, including a plurality of small ferrite annular elements and a fragile ceramic tube which are assembled together in proper fashion to form the filter.

In another form of prior art filter construction, the inductance is provided by a ferrite disc having a plurality of apertures for receiving connector contacts, thereby minimizing the number of parts required. Also, a conductive disc having a plurality of apertures receiving the terminals has been employed as a part of a capacitor feature of the filter. However, an individual dielectric tube for each capacitor is required.

The following U.S. patents disclose filter connectors of the general type discussed hereinabove: U.S. Pat. Nos. 3,002,162; 3,447,104; 3,535,676; 3,573,677; 3,721,869; and 3,854,107.

It will be appreciated that the filtering techniques employed in the connectors described hereinabove and in the aforementioned patents are not practical for connectors having a large number of contacts, such as telephone connectors, because a large number of parts are required to provide the filtering capacity, which results in costly construction in terms of manufacturing and assembly. A typical connector utilized in the telephone industry is disclosed in U.S. Pat. No. 3,002,176 to Yopp and incorporates 50 contacts. Furthermore, such filtering arrangements cannot be readily incorporated into connectors already installed in the field since the filter elements must be mounted around the contacts in the connectors.

An alternative form of filter connector is disclosed in U.S. Pat. No. 3,538,464 to Walsh. The Walsh patent discloses a filter connector utilizing a multi-layer monolithic ceramic capacitor. The contacts in the connector extend through apertures in the capacitor. Alternate line electrode plates in the capacitor extend into the wall of each aperture and are joined by a conductive layer on the wall which is in turn connected to the contact in the aperture. Capacitor ground plates are embedded in the dielectric substrate of the capacitor between the live electorde plates and extend to the outer periphery of the substrate where they are electrically connected to the housing of the connector. While such a structure minimizes the number of parts required to provide filtering capacity in a connector, it has the disadvantage that, like the other filter connectors discussed above, the capacitor assembly is a feed through arrangement. That is, the contacts must be mounted through the capacitor units.

The prior art feed through filter arrangements are not practical for incorporation into connectors already installed in the field. Furthermore, feed through filter arrangements could be incorporated into standard connectors, such as those utilized in the telephone industry, only by completely redesigning the connector and retooling, which would be very costly.

The purpose of the present invention is to provide low cost and convenient filtering capacity for already installed telephone systems or the like which will not require replacement or modification of the connector presently utilized in the systems. Another object of the invention is to provide filters in standard connectors without requiring reconstruction or redesign of the connectors.

SUMMARY OF THE INVENTION

According to the principal aspect of the present invention, there is provided a filter connector comprising an electrical connector housing having at least one row of contacts therein. A monolithic capacitor is mounted on the connector housing along one side of the row of contacts. The capacitor comprises a dielectric substrate having a plurality of parallel, spaced live electrodes on the face thereof facing the contacts. The electrodes are aligned with the contacts and are electrically connected thereto. At least one second electrode is mounted on the substrate in capacitive relation to the live electrodes. In a preferred embodiment of the invention, the second electrode is a ground electrode which extends across the dielectric and is connected to the housing of the connector.

Preferably, the connector is in the form of an adaptor which is plug-compatible with standard connectors, such as telephone connectors of the general type disclosed in the aforementioned Yopp patent. It will be appreciated, however, that the invention is not limited to such a connector, or to simply telephone connectors, but instead is applicable to any connector arrangement. For an adaptor connector, a second connector housing is mounted on the monolithic capacitor opposite to the first-mentioned connector housing in the assembly described above, with the contacts thereon electrically connected to the live electrodes on the capacitor. In the case of a standard telephone connector which utilizes two rows of contacts, the monolithic capacitor is provided with parallel spaced live electrodes on its opposite faces. The edges of the capacitor are mounted between the rows of contacts of each of the connectors with the live electrodes thereon electrically connected to the contacts. In such an arrangement, one or more ground planes may be embedded in the ceramic substrate of the monolithic capacitor and connected to the two connector housings.

A connector adaptor as described hereinabove may be readily constructed by mounting the monolithic capacitor on the connector halves of standard electrical connectors, without requiring reconstruction or reassembly of the connector member or the contacts therein and without any auxiliary wiring operations. The resulting adaptor may be mounted in the field with existing connectors, thereby eliminating the need for replacing the connectors which are already installed.

The invention is also adaptable for providing in-line filtering capacity for electrical connectors with a minimum of cost due to the simplicity of the assembly and the small number of parts required.

Other objects and advantages of the invention will become more apparent from the following description taken in connection with the accompanying drawings.

BRIEF DESCRIPTION OF THE DRAWINGS

FIG. 1 is a perspective view of a filter connector adaptor in accordance with the present invention;

FIG. 2 is an exploded view of the adaptor illustrated in FIG. 1 showing the cover of the adaptor removed and a potting material covering the monolithic capacitor of the adaptor;

FIG. 3 is a perspective view of the adaptor with the epoxy coating and cover removed, and with spacer members shown which are used during assembly of the adaptor;

FIG. 4 is a top plan view of the adaptor illustrated in FIG. 3 with sections of the walls of the housing of the connector member of the adaptor removed to show the contacts therein;

FIG. 5 is a bottom plan view of the monolithic capacitor utilized in the adaptor illustrated in FIGS. 1 to 4;

FIG. 6 is a sectional view taken along line 6—6 of FIG. 5 showing how the ground planes are embedded in the ceramic substrate of the capacitor;

FIG. 7 is a sectional view taken along line 7—7 of FIG. 6 showing the layout of one ground plane;

FIG. 8 is a schematic diagram illustrating the electrical equivalent of the filter arrangement employed in the adaptor of the invention; and FIG. 9 is a transverse sectional view through a multilayer monolithic capacitor which may be utilized in the invention.

DESCRIPTION OF THE PREFERRED EMBODIMENTS

Reference is now made to FIGS. 1 to 8 of the drawings which illustrate the preferred form of the connector of the present invention, generally designated 10, constructed as an adaptor which may be mounted between mating plug and receptacle connector members, such as disclosed in the aforementioned patent to Yopp. The adaptor 10 comprises a receptacle connector member 12 and a plug receptacle member 14. The plug and receptacle members may be identical to those described in the Yopp patent. Accordingly, the Yopp patent is incorporated herein by reference. The receptacle connector member comprises a conductive housing 16 containing an insulator 18 as seen in FIG. 4. Two parallel spaced rows of contacts 20 are mounted in the insulator 18. Each contact has a forward contacting portion 22 and a rear termination portion 24. The contacting portions 22 of the contacts are adjacent to the mating end 26 of the connector housing while the termination ends of the contact extend rearwardly beyond the termination end 28 of the housing so that they are exposed thereat. The plug and receptacle connector members are aligned with their termination ends facing each other. The plug connector member 14 is identical to the receptacle connector member 12 except that the contacts therein are arranged to engage with the contacts of a mating receptacle connector, which may be identical to the receptacle connector member 12. Thus, the adaptor 10 of the invention is capable of being connected between mating plug and receptacle connector members identical to the members 12 and 14, respectively. The receptacle and plug connector members 12 and 14 may be standard parts readily available in the telephone industry.

A monolithic ceramic capacitor, generally designated 30, is mounted between the termination ends 28 of the connector members 12 and 14. As illustrated, the capacitor has a rectangular configuration, with parallel end edges 32 and 34 and opposed side edges 36 and 38. The edges 32 and 34 of the capacitor are mounted between the two rows of termination portions 24 of the contacts in the respective connector members 12 and 14. In order to provide line-to-ground capacitive capacity for the adaptor, parallel spaced live electrodes 40 and 42 are provided on the upper and lower surfaces, respectively, of the ceramic dielectric substrate 44 of the capacitor. The spacing of the live electrodes corresponds to the spacing of the termination portions 24 of the contacts 20. The capcitor is located between the two rows of the contacts in each of the connector members so that the live electrodes are aligned with the termination portions of the contacts. The contacts are joined to the electrodes by solder or the like. Thus, it is seen that the monolithic capacitor of the present invention is mounted along one side of the termination portions of each row of contacts with the live electrodes disposed on the outer faces of the substrate of the capacitor so as to lie immediately adjacent to the contacts. Therefore, a capacitive connection is made to the contacts without any necessity of modifying the contacts per se or the connector members in which they are mounted.

A pair of ground planes 46 are embedded in the ceramic substrate 44 of the capacitor. The ground planes are parallel to each other and to the upper and lower surfaces of the capacitor so as to be in capacitive relation to the live electrodes 40 and 42. As seen in FIG. 4, the ground planes extend completely across the substrate to the side edges 36 and 38 thereof. A conductive coating 48 is provided on each of the side edges which electrically connects the ground planes 46. The coatings 48 provide large conductive surface areas for making a ground connection to the housings 16 of the plug and receptacle connector members. Preferably, such ground connection is provided by means of metallic straps 50 which are soldered to the conductive coatings 48 and are connected, by any suitable means, at their opposite ends to the rear portions of the connector housings 16, as best seen in FIG. 4.

In assemblying the parts of the adaptor 10 of the present invention, preferably spacer members 52 are assembled to the mounting flanges 54 of the connector housings of the plug and receptacle connector members to hold the monolithic capacitor between the two rows of contacts of the connector members. The termination portions of the contacts are electrically connected to the live electrodes on the opposite faces of the capacitor preferably by wave soldering techniques. Thereafter, the straps 50 are soldered to the outer conductive layers 48 on the substrate and the connector housings. Then a potting compound 56 is applied over the contacts and capacitor, as seen in FIG. 2. After the potting compound cures, the spacer members 52 may be removed from the connector housing. Thereafter a cover consisting of top and bottom pieces 58 and 60 and side pieces 62 and 64 may be mounted over the potted region of the adaptor in any suitable fashion so as to provide a protective enclosure for the capacitor, as illustrated in FIG. 1.

FIG. 8 is a schematic diagram illustrating the line-to-ground capacitive coupling which is provided by the monolithic capacitor 30 of the present invention. While two ground planes 46 are shown in the drawings as being embedded in the substrate of the capacitor, it will be appreciated that a single common ground plane could be utilized instead. As a further alternative, the ground planes 46 could be eliminated to provide only a line-to-line connection. This connection uses the fewest possible capacitor electrodes for the smallest capacitance value for a given line-to-line attenuation requirement. However, it provides no line-to-ground attenuation of in-phase noise voltages. By connecting capacitors for line-to-ground, as in the embodiment illustrated in the drawings, the common mode noise and voltage spikes to ground can be attenuated as well as noise appearing line-to-line. Although the line-to-ground connection requires twice as many capacitors, this arrangement is preferred in order to reduce EMI.

A combined line-to-line and line-to-ground capacitive connection may be provided in a multi-layer monolithic capacitor arrangement, such as illustrated in FIG. 9, wherein the ground planes are indicated at 72, and a second set of three live electrodes are indicated at 74. By splitting the capacitors in this manner, effective line-to-line capacitance can be achieved using a smaller value of capacitance line-to-ground. This helps to reduce the need for very close capacitor tolerances to maintain the specified impedance balance. While this line-to-line noise attenuation is maintained, the in-phase noise signals appearing line-to-ground will be attenuated less. While the combination mulit-layer capacitor illustrated in FIG. 9 represents a compromise by providing some line-to-line filtering with a reduced tolerance requirement, the multi-layer device is relatively costly to manufacture. Therefore, the monolithic capacitor arrangement illustrated in FIGS. 5 to 7 provides the best compromise of filtering capacity and low cost of manufacture, and therefore is preferred for wide spread use in the telephone industry.

It will be appreciated that the present invention provides a novel monolithic ceramic capacitor which is designed for direct external connection to the electrical contacts of a standard electrical connector, thereby eliminating the need for a wired connection and thus keeping the total number of soldered connections to a minimum. As stated previously, a wave soldering technique may be utilized for simultaneously electrically connecting each of the contacts to the live electrodes of the monolithic capacitor, thereby minimizing manufacturing costs.

While the adaptor as illustrated in the drawings and disclosed hereinabove has been described as employing two electrical connectors each containing two rows of contacts, it will be appreciated that the monolithic ceramic capacitor could be mounted between two connectors each having only a single row of contacts, in which case the live electrodes on one face of the capacitor could be eliminated. As a further alternative, the capacitor could be directly incorporated into a connector at the time of its manufacture rather than into an adaptor connector as illustrated in the drawings. When the capacitor is incorporated directly into the connector, it would be mounted between the two rows of contacts of the connector in a similar fashion to that described hereinabove. If the termination ends of the contacts are formed as solder pots, which is typical with telephone connectors, then wires could be soldered directly to the contacts in a normal fashion and potted for extra protection of the capacitor.

Therefore, in contrast to the costly and complex feed through capacitor arrangements which have been utilized in prior art filter connectors, the present invention provides a filter connector wherein a monolithic capacitor is mounted along a side of a row of contacts with the live electrodes on the face of the capacitor soldered directly to the contacts. Therefore, no material alteration of the connector is required, thereby permitting filtering capacity to be introduced into presently existing connectors in a simple and inexpensive fashion.

What is claimed is:

1. A filter connector comprising:

an electrical connector housing having at least one row of contacts therein, each said contact having a forward contacting portion adapted to engage a contact of a mating electrical connector and a rear termination portion;

a monolithic capacitor extending along one side of said row of contacts;

said monolithic capacitor comprising a dielectric substrate having a plurality of parallel, spaced live electrodes on an outer face thereof facing said contacts and aligned with said contacts, said contacts being electrically connected to said live electrodes; and at least one second electrode means on said substrate in capacitive relation to said live electrodes.

2. A filter connector assembly comprising:

an electrical connector housing having a forward mating end and a rear termination end;

at least one row of contacts mounted in said housing having forward contacting portions adjacent to said mating end and rear termination portions adjacent to said termination end, the forward contacting portion of each contact being adapted to engage a contact of a mating electrical connector;

a monolithic capacitor mounted adjacent to said termination end of said housing and extending along one side of said termination portions of said row of contacts;

said capacitor comprising a dielectric substrate having a set of parallel spaced live electrodes on an outer face thereof facing said contacts, said live electrodes being aligned with said contacts;

said termination portions of said contacts being electrically connected to said live electrodes; and at least one second electrode means on said substrate in capacitive relation to said live electrodes.

3. A filter connector assembly as set forth in claim 2 wherein:

said second electrode means comprises a ground plane extending across said substrate and electrically connected to said housing.

4. A filter connector assembly as set forth in claim 3 wherein:

said ground plane is embedded in said substrate.

5. A filter connector assembly as set forth in claim 3 wherein:

said substrate has elongated generally parallel forward and rear edges and opposed side edges;

said forward edge being adjacent to said termination portions of said contacts;

said ground plane extending over at least one of said side edges; and means electrically connecting said ground plane on said side edge to said housing.

6. A filter connector assembly as set forth in claim 2 wherein:

said termination portions of said contacts are exposed at said termination end of said housing; and p1 said capacitor is mounted on said termination end.

7. A filter connector assembly as set forth in claim 2 wherein:

said housing contains a second row of said contacts extending parallel to said first-mentioned row and spaced therefrom;

said capacitor is mounted between said two rows of contacts;

said second electrode means comprises a second set of parallel spaced live electrodes on the face of said substrate facing said second row of contacts, said electrodes of said second set being aligned with said contacts in said second row; and said termination portions of said contacts in said second row being electrically connected to said second set of live electrodes.

8. A filter connector assembly as set forth in claim 7 including:

at least one ground plane embedded in said substrate in capacitive relation to said live electrodes, and electrically connected to said housing.

9. A filter connector assembly as set forth in claim 7 including:

a pair of generally parallel spaced ground planes embedded in said substrate and each extending across said substrate to at least one side edge thereof.

10. A filter connector assembly as set forth in claim 9 including:

a conductive layer on said side edge electrically connecting said ground planes.

11. A filter connector assembly as set forth in claim 10 including:

means electrically connecting said conductive layer to said housing.

12. A filter connector assembly as set forth in claim 2 including:

a second electrical connector housing having a forward mating end and a rear termination end, said termination end facing said termination end of said first-mentioned housing;

at least one row of contacts mounted in said second housing having forward contacting portions adjacent to said mating end and rear termination portions adjacent to said termination end;

said capacitor extending between said terminaion ends of said housings with said live electrodes thereon facing and aligned with said contacts in said second housing; and said termination portions of said contacts in said second housing being electrically connected to said live electrodes.

13. A filter connector assembly as set forth in claim 12 wherein:

said second electrode means comprises a ground plane embedded in said substrate and electrically connected to said housings.

14. A filter connector comprising:

a conductive housing having a forward mating end and a rear termination end, and containing two parallel, spaced rows of contacts therein, each said contact having a rear termination portion exposed at the rear of said housing and a forward contacting portion adjacent to said forward mating end of said housing adapted to engage a contact of a mating electrical connector;

a monolithic capacitor mounted on said rear of said housing between said two rows of contacts; and said capacitor comprising a dielectric substrate having two rows of parallel, spaced live electrodes on its opposite faces electrically connected to said contacts.

15. A filter connector as set forth in claim 14 including:

at least one ground plane embedded in said substrate in capacitive relation to said live electrodes, and electrically connected to said housing.

16. A filter connector adaped for mounting between the respective forward mating and rear termination ends of a pair of electrical connectors comprising:

a pair of electrical connectors having forward mating ends and rear termination ends, the termination ends of said connectors facing each other;

at least one row of contacts in each of said connectors;

a monolithic capacitor mounted between said connectors;

said capacitor comprising a dielectric substrate having a plurality of parallel, spaced live electrodes on at least one face thereof aligned with and electrically connected to said contacts in said connectors; and at least one second electrode means on said substrate in capacitive relation with said live electrodes.

17. A filter connector adaptor for mounting between the respective forward mating and rear termination ends of a pair of electrical connectors comprising:

a pair of electrical connectors having forward mating ends and rear termination ends, the termination ends of said connectors facing each other, each connector having a conductive housing;

two parallel spaced rows of contacts in each of said connectors;

a monolithic capacitor mounted between said connectors having end edges disposed between the respective rows of contacts in said connectors;

said capacitor comprising a dielectric substrate having a plurality of parallel, spaced live electrodes on its opposite faces aligned with and electrically connected to said contacts in said connectors; and a ground plane embedded in said substrate in capacitive relation to said live electrodes, and electrically connected to said housing.

18. A filter connector adaptor as set forth in claim 17 wherein:

there are provided two of said ground planes embedded in said substrate;

said ground planes extending across said substrate to at least one side edge thereof extending lengthwise between said connectors; and a conductive layer on said side edge connecting said ground planes.

* * * * *